(12) United States Patent
Murray et al.

(10) Patent No.: US 9,997,406 B2
(45) Date of Patent: Jun. 12, 2018

(54) COLUMNAR INTERCONNECTS AND METHOD OF MAKING THEM

(71) Applicant: INTERNATIONAL BUSINESS MACHINES CORPORATION, Armonk, NY (US)

(72) Inventors: Conal E. Murray, Yorktown Heights, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/015,389

(22) Filed: Feb. 4, 2016

(65) Prior Publication Data

US 2017/0229344 A1 Aug. 10, 2017

(51) Int. Cl.
| | | |
|---|---|---|
| H01L 23/48 | (2006.01) | |
| H01L 23/52 | (2006.01) | |
| H01L 29/40 | (2006.01) | |
| H01L 21/4763 | (2006.01) | |
| H01L 21/44 | (2006.01) | |
| H01L 21/768 | (2006.01) | |
| H01L 21/288 | (2006.01) | |
| H01L 23/528 | (2006.01) | |
| H01L 23/532 | (2006.01) | |

(52) U.S. Cl.
CPC .... *H01L 21/76883* (2013.01); *H01L 21/2885* (2013.01); *H01L 21/76816* (2013.01); *H01L 21/76838* (2013.01); *H01L 21/76843* (2013.01); *H01L 21/76871* (2013.01); *H01L 21/76873* (2013.01); *H01L 21/76877* (2013.01); *H01L 23/5283* (2013.01); *H01L 23/53228* (2013.01); *H01L 23/53214* (2013.01); *H01L 23/53242* (2013.01); *H01L 23/53257* (2013.01)

(58) Field of Classification Search
CPC ......... H01L 21/76877; H01L 21/76883; H01L 21/76843; H01L 21/76838; H01L 21/76879; H01L 21/76816; H01L 21/76871; H01L 23/5283
USPC ......... 257/751, 754, 758, E21.584, E21.585, 257/E21.582, E21.591; 438/653, 643, 438/622

See application file for complete search history.

(56) References Cited

U.S. PATENT DOCUMENTS

| | | |
|---|---|---|
| 5,472,911 A | 12/1995 | Dreyer et al. |
| 6,043,153 A | 3/2000 | Nogami et al. |
| 6,388,269 B1 | 5/2002 | Saito |

(Continued)

*Primary Examiner* — Fernando L Toledo
*Assistant Examiner* — Aaron Gray
(74) *Attorney, Agent, or Firm* — Cantor Colburn LLP; Vazken Alexanian (57) ABSTRACT

Disclosed herein is an interconnect structure, including: a dielectric material layer having a cavity having a height, width and length within a dielectric material layer wherein the width is less than or equal to about 100 nanometers and the height to width ratio is less than or equal to about 2.5; a diffusion barrier liner layer disposed in the cavity on the dielectric material; an optional crystallization seed layer disposed on the diffusion barrier liner layer; and a conductive material disposed on the crystallization seed layer when present and filling the opening. When the crystallization seed layer is not present the conductive material is disposed on the diffusion barrier liner.

18 Claims, 6 Drawing Sheets

(56) References Cited

U.S. PATENT DOCUMENTS

| | | | |
|---|---|---|---|
| 6,403,462 B1 * | 6/2002 | Hasunuma | H01L 21/32051 257/E21.576 |
| 6,417,571 B1 | 7/2002 | Nogami et al. | |
| 7,843,063 B2 | 11/2010 | Baker-O'Neal et al. | |
| 8,138,603 B2 | 3/2012 | Hsu et al. | |
| 8,828,870 B2 | 9/2014 | Cabral, Jr. et al. | |
| 8,852,305 B2 | 10/2014 | Andersson et al. | |
| 8,864,861 B2 | 10/2014 | Andersson et al. | |
| 8,888,841 B2 | 11/2014 | Pandelidis et al. | |
| 8,893,711 B2 | 11/2014 | Kennedy | |
| 8,895,099 B2 | 11/2014 | Atanasoska et al. | |
| 8,993,472 B2 | 3/2015 | Roller et al. | |
| 9,005,769 B2 | 4/2015 | Lambert et al. | |
| 9,017,762 B2 | 4/2015 | Rozak et al. | |
| 9,023,486 B2 | 5/2015 | Nagaraj et al. | |
| 9,031,184 B2 | 5/2015 | Cabrero et al. | |
| 9,034,465 B2 | 5/2015 | Peters et al. | |
| 9,034,479 B2 | 5/2015 | Nagaraj et al. | |
| 9,153,558 B2 | 10/2015 | Filippi et al. | |
| 9,190,323 B2 | 11/2015 | Zhang et al. | |
| 2005/0224980 A1 * | 10/2005 | Leu | H01L 21/76888 257/758 |
| 2006/0113685 A1 * | 6/2006 | Ueki | H01L 23/53233 257/785 |
| 2007/0197012 A1 * | 8/2007 | Yang | H01L 21/76805 438/597 |
| 2009/0206484 A1 * | 8/2009 | Baker-O'Neal | H01L 21/76873 257/751 |
| 2011/0034026 A1 * | 2/2011 | Sunayama | H01L 21/2885 438/653 |
| 2013/0187273 A1 | 7/2013 | Zhang et al. | |
| 2013/0252417 A1 * | 9/2013 | Ishizaka | C23C 14/025 438/643 |
| 2014/0129087 A1 | 5/2014 | Takenaka et al. | |
| 2014/0301861 A1 | 10/2014 | Bruce et al. | |
| 2014/0301867 A1 | 10/2014 | Bruce et al. | |
| 2014/0324156 A1 | 10/2014 | Yin et al. | |
| 2014/0332924 A1 * | 11/2014 | Bao | H01L 23/5256 257/529 |
| 2014/0332965 A1 | 11/2014 | Bao et al. | |
| 2015/0129087 A1 | 5/2015 | Hintz et al. | |
| 2015/0132926 A1 | 5/2015 | D'Evelyn et al. | |

* cited by examiner

FIG. 11

COLUMNAR INTERCONNECTS AND METHOD OF MAKING THEM

BACKGROUND

Generally, semiconductor devices include a plurality of circuits that form an integrated circuit (IC) fabricated on a semiconductor substrate. A complex network of signal paths is routed to connect the circuit elements distributed on the surface of the substrate.

To efficiently route these signals across the device, multilevel or multilayered schemes are used, for example, single or dual damascene wiring structures. The wiring structure may include, for example, copper or a copper alloy. Copper-based interconnects may provide higher speed signal transmission between large numbers of transistors on a complex semiconductor chip than other types of interconnects, for example, aluminum-based interconnects.

Interconnects must reliably transmit power from one portion of the circuit to another with a minimal loss of power due to resistance. This becomes increasingly difficult as the size of the interconnect decreases in response to overall decreases in feature size.

SUMMARY

Disclosed herein is a method of making an interconnect structure. The method comprises forming a cavity having a height, width and length within a dielectric material layer wherein the width is less than or equal to about 100 nanometers and the height to width ratio is less than about 2.5; disposing a diffusion barrier liner layer within the opening; disposing a conductive material on the diffusion barrier liner layer to fill the cavity and form a layer on the dielectric material; and annealing the conductive material.

Also disclosed is a method of making an interconnect structure, the method including forming a cavity having a height, width and length within a dielectric material layer wherein the width is less than or equal to about 100 nanometers and the height to width ratio is less than about 2.5; disposing a diffusion barrier liner layer within the opening; disposing a crystallization seed layer on the diffusion barrier liner layer; disposing a conductive material on the crystallization seed layer to fill the cavity and form a layer on the dielectric material; and annealing the conductive material.

The above described methods produce an interconnect structure. The interconnect structure includes: a dielectric material layer including a cavity having a height, width and length within a dielectric material layer wherein the width is less than or equal to about 100 nanometers and the height to width ratio is less than or equal to about 2.5; a diffusion barrier liner layer disposed in the cavity on the dielectric material; an optional crystallization seed layer disposed on the diffusion barrier liner layer; and a conductive material disposed on the crystallization seed layer when present and filling the opening. When the crystallization seed layer is not present the conductive material is disposed on the diffusion barrier liner.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

There are currently three different modes of copper diffusion. One mode is copper diffusion along grain boundaries of a copper interconnect structure. Another mode is copper diffusion at a surface of a copper interconnect structure, that is, at an interface at which the copper interconnect structure adjoins another material. An alternate mode is copper bulk diffusion through grains, i.e., from one side of a grain to the other side of the grain. Typically the rate of diffusion is higher for copper diffusion along grain boundaries and lower for copper bulk diffusion through grains.

Thus, it is desired to form a copper interconnect structure containing a metal line in which the metal line has a bamboo-like pattern in the grain microstructure, or a "bamboo microstructure". In a bamboo microstructure, the lateral width of a grain is the same as the width of the metal line or the metal via. The length of the grain is greater than the width of the metal line so that grain boundaries look like a stalk of a bamboo plant with notched segmentation.

It is optimal to have a bamboo microstructure where grains span the width and height of a line or via. The phenomenon of electromigration occurs when a current flowing in the line, due to an externally applied field, leads to a net drift of copper at divergent sites such as grain boundaries and material interfaces. The net drift of copper can result in the formation of voids in the line, resulting in unreliable performance and failure. Because electrical current flows along the linear direction of a metal line and any electromigration is forced to occur "through" that is, substantially perpendicular to the plane of grain boundaries, the bamboo microstructure offers significantly more resistance to electromigration than other microstructures. The bamboo microstructure substantially restricts diffusion along grain boundaries because bamboo grain boundaries are arranged substantially at right angles to the current flow.

A bamboo microstructure has been difficult to achieve in interconnect structures having widths less than about 100 nanometers. The formation of a bamboo microstructure can be reliably achieved after annealing in interconnect structures having a width of less than about 100 nanometers by maintaining the aspect ratio (the ratio of height to width) to less than or equal to about 2.5. Using the desired aspect ratio when creating the cavity in the dielectric results in an interconnect structure with a bamboo microstructure and hence greater resistance to electromigration and greater reliability. The interconnect has an average grain size which is greater than the width of the cavity in the dielectric.

Figure 1:
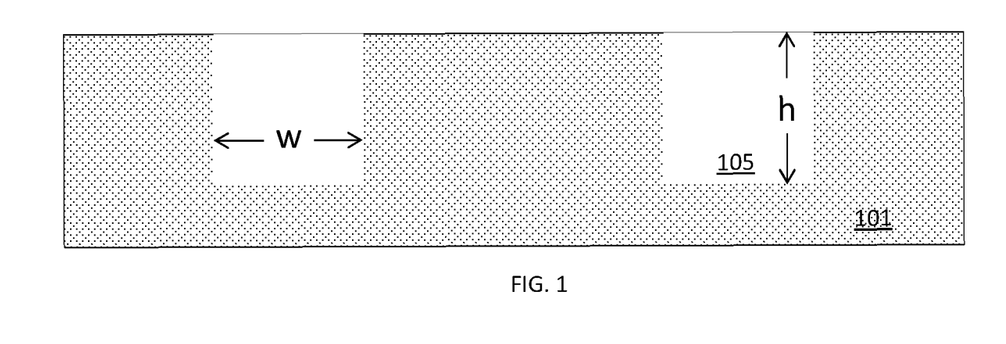
FIG. 1 is a cross-sectional side view of a dielectric material having cavities in the dielectric material for the formation of the interconnect structures as described herein.

Turning to the Figures, FIGS. 1-9 illustrate a process flow for making an interconnect structure according to various embodiments. FIG. 1 is a cross-sectional side view of a patterned dielectric material 101 having cavities 105. The cavities have a length (not shown), a width, w, and a height, h. The width, w, is less than or equal to about 100 nanometers and the ratio of height to width is less than or equal to about 2.5. In some embodiments the width is about 10 nanometers to about 100 nanometers. In some embodiments the ratio of height to width is about 0.5 to about 2.5. In some embodiments the ratio of height to weight is about 0.1 to about 0.5. The cavities 105 may be formed from any suitable patterning and etching process such as, for example, lithography, reactive ion etching (ME) or another suitable anisotropic etching process.

In one embodiment, the dielectric material 101 may be non-porous. In another embodiment, the dielectric material 101 may be porous. Some examples of suitable dielectrics that can be used as the dielectric material 101 include, but are not limited to, $SiO_2$, silsesquioxanes, carbon-doped oxides (i.e., organosilicates) that include atoms of Si, C, O and H, thermosetting polyarylene ethers, or multilayers thereof.

The interconnect dielectric material 101 may have a dielectric constant that is about 4.0 or less, or a dielectric constant of about 2.8 or less. All dielectric constants mentioned herein are relative to a vacuum, unless otherwise noted. The thickness of the interconnect dielectric material 101 may vary depending upon the type of dielectric material used as well as the exact number of dielectrics layers within the dielectric material 101.

Figure 2:
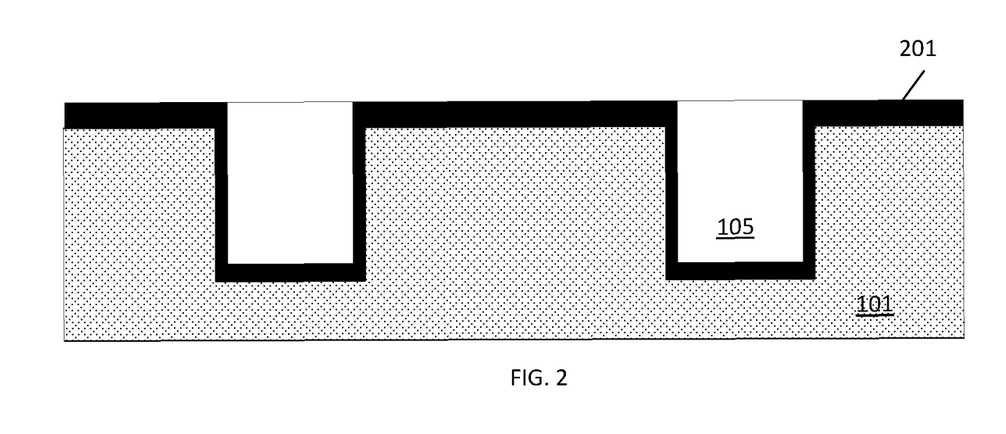
FIG. 2 is a cross-sectional side view showing the cavities including a diffusion barrier liner layer.

As shown in FIG. 2, a metal diffusion barrier liner layer 201 is disposed within the cavity before depositing the conductive material. Non-limiting examples of suitable materials for the metal diffusion barrier liner layer 201 include tantalum (Ta), titanium (Ti), cobalt (Co), tungsten, ruthenium (Ru), ruthenium tantalum (RuTa), their nitrides, or any combination thereof. The metal diffusion barrier liner layer 201 may be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. It is expressly contemplated that the metal diffusion barrier liner layer 201 may comprise more than one material. For example, the metal diffusion barrier liner layer 201 may comprise layers of different materials.

The thickness of the diffusion barrier liner layer 201 may vary depending on the deposition process used as well as the material employed. In some embodiments, the diffusion barrier liner layer 201 has a thickness in a range of about 1 nanometer to about 25 nanometers. In other embodiments, the diffusion barrier liner layer 201 has a thickness in a range of about 1 nanometer to about 10 nanometers, or in the range of about 1 nanometer to about 5 nanometers.

Figures 3, 4:
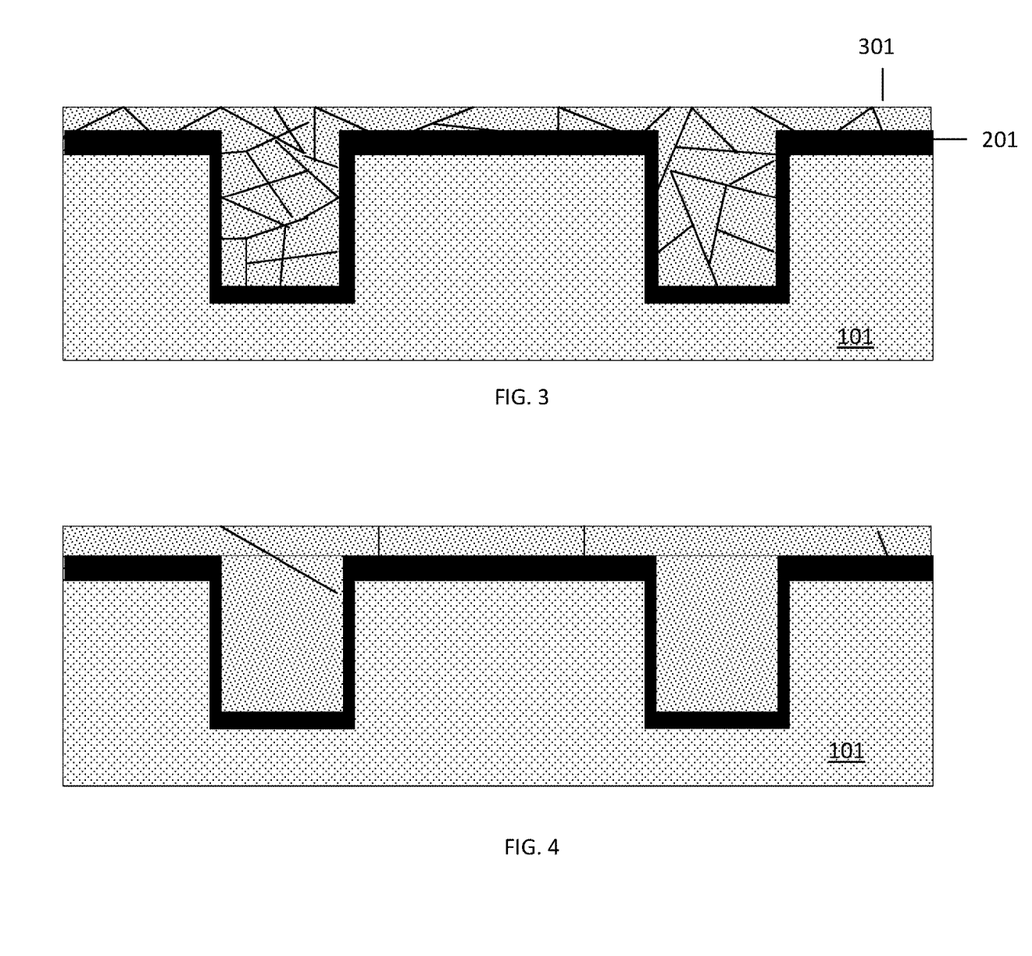
FIG. 3 is a cross-sectional side view showing conductive material disposed on the diffusion barrier liner layer and filling the cavities.
FIG. 4 is a cross-sectional side view after annealing the dielectric material having cavities including a diffusion barrier liner layer and conductive material.

The conductive material 301 is deposited on diffusion barrier liner layer 201 as shown in FIG. 3. The conductive material 401 fills the remaining portions of the interconnect cavity and forms a layer outside of the opening. The conductive material 301 may include, for example, polysilicon, SiGe, a conductive metal, an alloy including at least one conductive metal, a conductive metal silicide or combinations thereof. In one embodiment, the conductive material 401 is a conductive metal such as copper (Cu), tungsten (W), aluminum (Al), cobalt (Co), ruthenium (Ru), or any combination thereof. In another embodiment, the conductive material 401 includes Cu or a Cu alloy, for example, AlCu.

The conductive material 301 may be formed by a deposition process, including, by not limited to, chemical vapor deposition (CVD), plasma enhanced chemical vapor deposition (PECVD), sputtering, chemical solution deposition or plating that fills from the bottom upwards (e.g., a bottom-up plating process). When the conductive material comprises copper the deposition process typically comprises electroplating. The initially deposited conductive material 301 shows a large number of grain boundaries as shown in FIG. 3.

After depositing the conductive material 301 the structure is annealed. Annealing comprises subjecting the structure to a temperature of about 100° to about 500° C. for a time of about 10 minutes to about 3 hours typically under a nitrogen atmosphere or a nitrogen/hydrogen atmosphere. In some embodiments, annealing continues for a time of about 30 minutes to about 1 hour. In some embodiments annealing occurs at a temperature of about 200° C. to about 400° C. During annealing recrystallization occurs and the grain size increases and results in a conductive material having a bamboo microstructure. As grain size increases the number of grain boundaries decreases as shown in FIG. 4. Annealing results in a conductive material having an average grain size that is greater than the width of the opening. Grain size, as used herein, is defined as the distance between a first grain boundary of a grain and a second grain boundary of the same grain as determined along a line which runs parallel to the bottom surface of the opening in the length direction. Average grain size can be determined by taking the average of the measured grain sizes.

For comparison, when a conductive material 301 is deposited as described above in a cavity having a width less than about 100 nanometers and an aspect ratio greater than about 2.5 the conductive material shows a different microstructure after annealing. More specifically, a bamboo microstructure is not formed and the annealed conductive material shows a significant number of triple points. A triple point is a point at which three grain boundaries meet. Triple points and the lack of a bamboo microstructure make the conductive material more vulnerable to electromigration and the subsequent formation of voids in the conductive material. The presence of voids can lead to an electrical open or failure.

Figure 5:
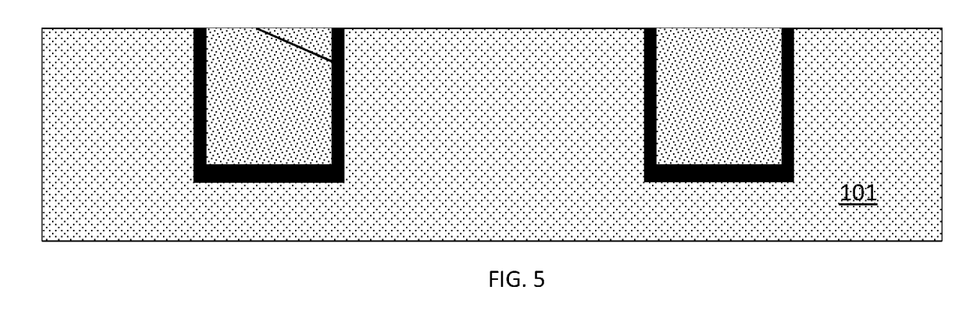
FIG. 5 is a cross-sectional side view after planarization to remove the diffusion barrier liner layer and conductive material outside of the cavities.

After annealing the conductive material 301, a planarization process such as, for example, chemical mechanical polishing (CMP) and/or grinding, is employed to remove portions of the conductive material 301 and the diffusion barrier liner layer 201 that extend above the mouth of the opening. FIG. 5 shows the diffusion barrier liner layer 201 in contact with the sidewalls and bottom of the cavity in the dielectric layer. The conductive material fills the remainder of the cavity and has a bamboo microstructure.

Figure 6:
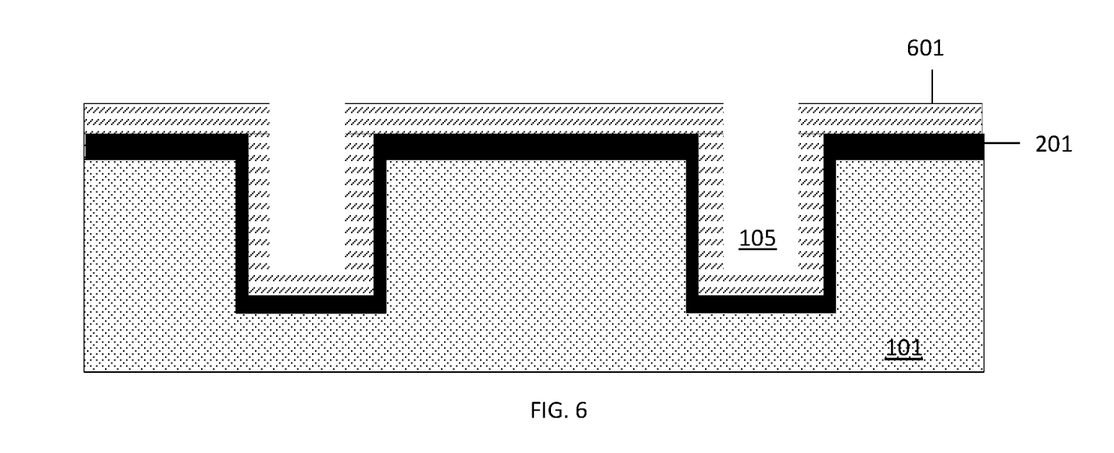
FIG. 6 is a cross-sectional side view showing a crystallization seed layer disposed on the diffusion barrier liner layer.

In an alternate embodiment shown in FIG. 6, a crystallization seed layer 601 is formed on the surface of the diffusion barrier liner layer 201. The crystallization seed layer 601 may be employed to selectively promote subsequent electroplating of a pre-selected conductive metal or metal alloy. The crystallization seed layer 601 may include, for example, Cu, a Cu alloy, Ir, an Ir alloy, Ru, a Ru alloy (e.g., TaRu alloy) or other noble metal or noble metal alloy having a low metal-plating overpotential.

The thickness of the crystallization seed layer 601 may vary depending on the material of the crystallization seed layer as well as the technique used in forming the same. In some embodiments, the crystallization seed layer 601 has a thickness in a range of about 1 nanometer to about 100 nanometers, or 1 nanometer to 50 nanometers. The crystallization seed layer 601 may be formed by a deposition process including, for example, CVD, PECVD, ALD, and PVD.

Figure 7:
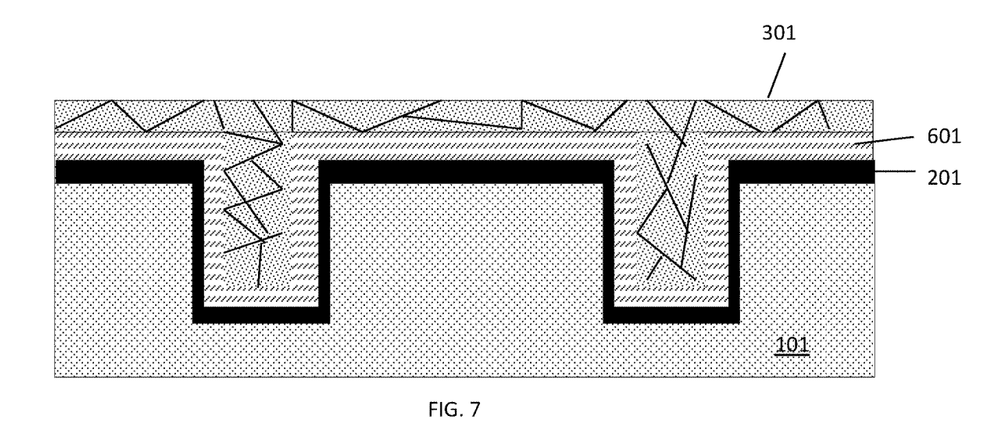
FIG. 7 is a cross-sectional side view showing conductive material disposed on the crystallization seed layer and filling the cavities.

The conductive material 301 is deposited on crystallization seed layer 601 as shown in FIG. 7. The conductive material 301 fills the remaining portions of the interconnect cavity and forms a layer outside of the opening. As discussed above, the conductive material 301 may include, for example, polysilicon, SiGe, a conductive metal, an alloy including at least one conductive metal, a conductive metal silicide or combinations thereof. In one embodiment, the conductive material 401 is a conductive metal such as copper (Cu), tungsten (W), aluminum (Al), cobalt (Co), ruthenium (Ru), or any combination thereof. In another embodiment, the conductive material 401 includes Cu or a Cu alloy, for example, AlCu.

The conductive material 301 may be formed by a deposition process, including, by not limited to, chemical vapor deposition (CVD), plasma enhanced chemical vapor deposition (PECVD), sputtering, chemical solution deposition or plating that fills from the bottom upwards (e.g., a bottom-up plating process). When the conductive material comprises copper the deposition process typically comprises electroplating. The initially deposited conductive material 301 shows a large number of grain boundaries as shown in FIG. 7.

Figure 8:
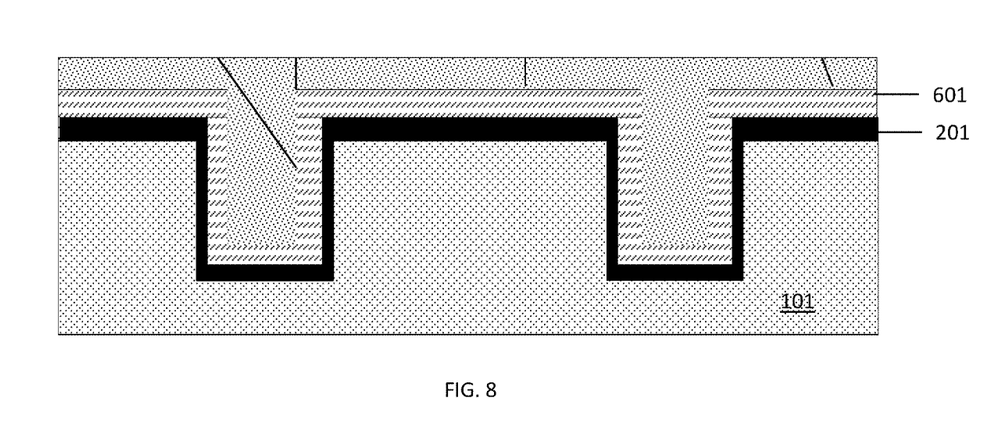
FIG. 8 is a cross-sectional side view after annealing the dielectric material having cavities including a diffusion barrier liner layer, a crystallization seed layer and conductive material.

After depositing the conductive material 301 the structure is annealed. Annealing comprises subjecting the structure to a temperature of about 100° to about 500° C. for a time of about 10 minutes to about 3 hours under a nitrogen atmosphere or a nitrogen/hydrogen atmosphere. In some embodiments, annealing continues for a time of about 30 minutes to about 1 hour. In some embodiments annealing occurs at a temperature of about 200° C. to about 400° C. During annealing recrystallization occurs and the grain size increases and results in a conductive material having a bamboo microstructure. As grain size increases the number of grain boundaries decreases as shown in FIG. 8. Annealing can result in a conductive material having an average grain size that is greater than the width of the opening.

Figure 9:
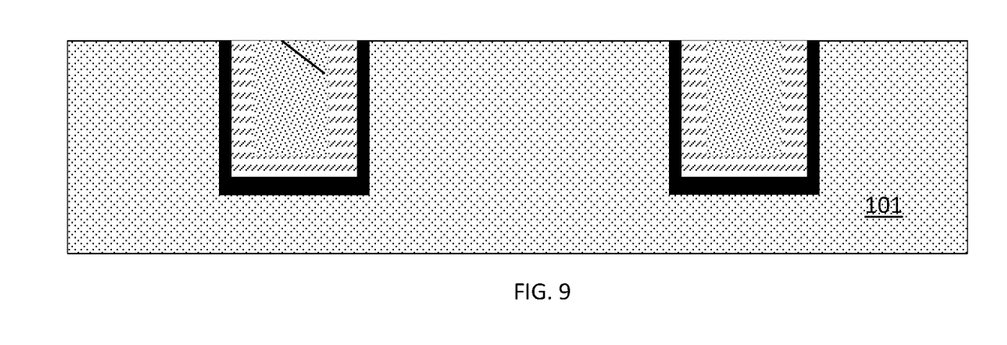
FIG. 9 is a cross-sectional side view after planarization to remove the diffusion barrier liner layer, crystallization seed layer and conductive material outside of the cavities.

After annealing the conductive material 301, a planarization process such as, for example, chemical mechanical polishing (CMP) and/or grinding, is employed to remove portions of the conductive material 301, the diffusion barrier liner layer 201 and the crystallization seed layer 601 that extend above the mouth of the opening. FIG. 9 shows the diffusion barrier liner layer 201 in contact with the sidewalls and bottom of the cavity in the dielectric layer with the crystallization seed layer 601 disposed on the diffusion barrier liner layer. The conductive material fills the remainder of the cavity and has a bamboo microstructure.

Figure 10:
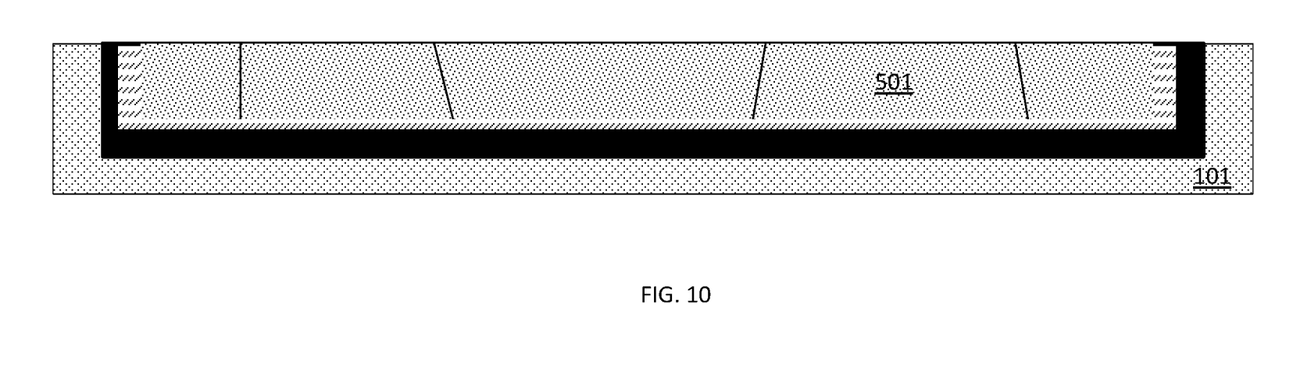
FIG. 10 is a cross-sectional longitudinal view after annealing and planarization showing the cavity in the dielectric having a diffusion barrier liner layer, a crystallization seed layer and conductive material filling the opening.

FIG. 10 is a longitudinal cross section of a single cavity of the structure shown in FIG. 9. As shown in FIG. 9, the conductive material has a bamboo microstructure.

Figure 11:
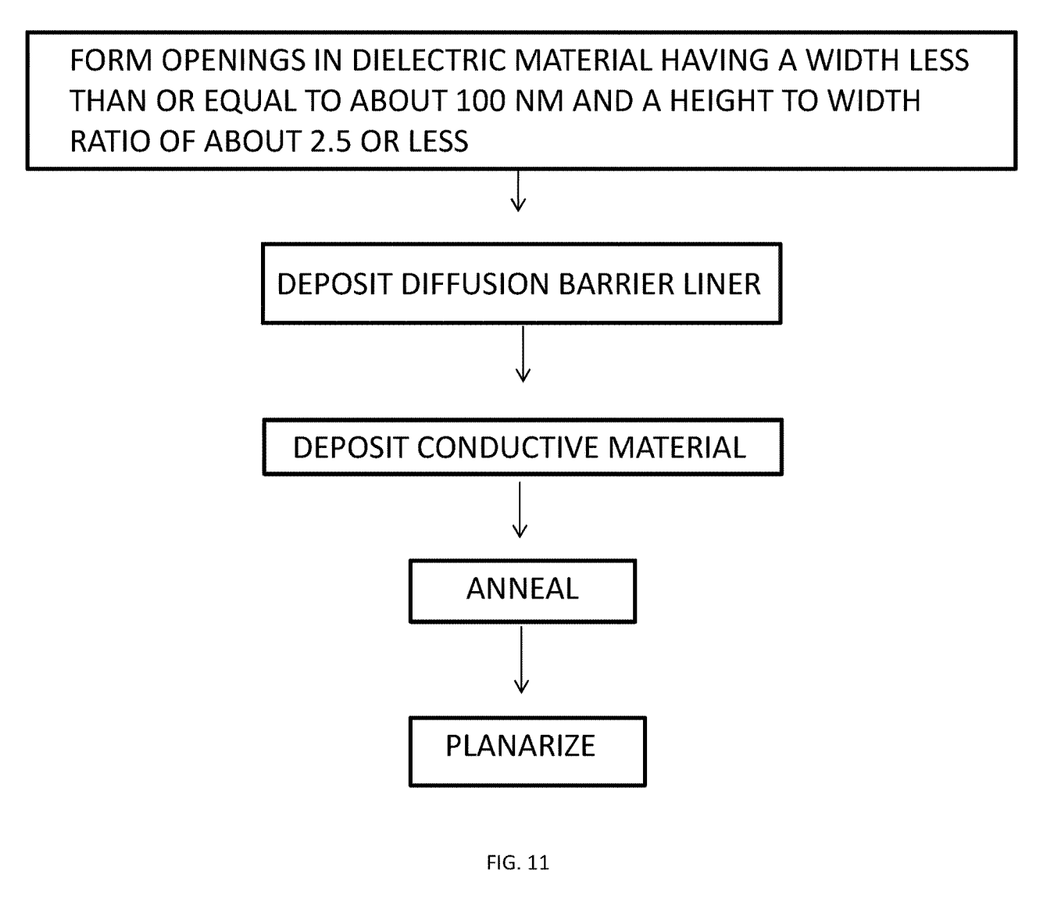
FIG. 11 is a process flow of the method described herein.

FIG. 11 is a process flow showing the key steps in the process. As shown in the figure, a cavity having specific characteristics is formed in a dielectric material. A diffusion barrier liner is deposited in the opening. A crystallization seed layer (not shown) can be deposited on top of the diffusion barrier liner. A conductive material fills the remainder of the opening. The structure is then annealed and planarized.

As described above, various embodiments described herein provide methods of making interconnect structures for semiconductor devices that have a width less than about 100 nanometers and an aspect ratio less than or equal to about 2.5. The conductive material of the interconnect structure has a bamboo microstructure. The conductive material has an average grain size greater than width of the interconnect opening.

More specifically the interconnect structure comprises a dielectric material layer including a cavity having a height, width and length within a dielectric material layer wherein the width is less than or equal to about 100 nanometers and the height to width ratio is less than or equal to about 2.5, a diffusion barrier liner layer disposed in the cavity on the dielectric material, an optional a crystallization seed layer disposed on the diffusion barrier liner layer, and a conductive material disposed on the crystallization seed layer when present and filling the opening. When the crystallization seed layer is not present the conductive material is disposed on the diffusion barrier liner.

Because the interconnect structure comprises a conductive material having a bamboo microstructure, the length of the interconnect structure can be greater than the "Blech" length. Mechanical stress at lengths less than the "Blech" length oppose the drift of the conductive material ions. By opposing the drift of the conductive material ions, the ion motion is diminished or stopped thus reducing or halting the electromigration process. It is also contemplated that the length of the interconnect structure can be less than the "Blech" length, thereby combining the effect of the mechanical stress with the bamboo microstructure.

In some embodiments, the interconnect structure comprises a cavity having a width of about 10 nanometers to about 100 nanometers. The ratio of the height to the width is about 0.1 to about 2.5, or about 0.1 to about 0.5. A diffusion barrier liner layer including tantalum nitride (TaN) is disposed on the bottom and the side walls of the opening. The diffusion barrier liner layer can have a thickness of about 1 nanometer to about 10 nanometers. An optional crystallization seed layer is disposed on the diffusion barrier liner layer. The optional crystallization seed layer comprises Cu. The optional crystallization seed layer, when present, has a thickness of about 1 nanometer to about 50 nanometers. A conductive material such as copper fills the remaining space in the opening. The conductive material has an average grain size of about the width of the opening to about 10 times the width of the opening. The conductive material has a bamboo microstructure.

The interconnect structure can further comprise vias to connect the structure to other conductive elements of the integrated circuit. While a damascene process has been described herein it is contemplated that when the interconnect structure further comprises one or more vias a dual damascene process may be employed. The interconnect structure can be combined with other interconnect structures of varying sizes and designs. Additionally, the interconnect structures can be layered.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making an interconnect structure, the method comprising:
   forming a cavity having a height, width and length within a dielectric material layer wherein the width is less than or equal to about 100 nanometers and the height to width ratio is less than about 2.5;
   disposing a diffusion barrier liner layer within the cavity;
   disposing a conductive material on a surface of the diffusion barrier liner layer to completely fill the cavity and form a layer on the dielectric material, the conductive material comprising polysilicon, silicon germanium (SiGe), an alloy thereof, a metal silicide thereof, or a combination comprising at least one of the foregoing; and
   recrystallizing the conductive material such that grain boundaries of the conductive material are arranged substantially orthogonal to a current flow along the length of the cavity, each grain boundary spanning the width and height of the cavity.

2. The method of claim 1, wherein the height to width ratio is about 0.1 to about 0.5.

3. The method of claim 1, wherein the conductive material comprises copper and is disposed by electroplating.

4. The method of claim 1, wherein after annealing the conductive material has an average grain size greater than the width of the opening.

5. The method of claim 1, wherein the conductive material has a bamboo microstructure.

6. A method of making an interconnect structure, the method comprising:
   forming a cavity having a height, width and length within a dielectric material layer wherein the width is less than or equal to about 100 nanometers and the height to width ratio is less than about 2.5;
   disposing a diffusion barrier liner layer within the cavity;
   disposing a crystallization seed layer on the diffusion barrier liner layer, the crystallization seed layer comprising Ir, an Ir alloy, Ru, or a Ru alloy;
   disposing a conductive material on the crystallization seed layer to completely fill the cavity and form a layer on the dielectric material, the conductive material comprising polysilicon, silicon germanium (SiGe), an alloy thereof, a metal silicide thereof, or a combination comprising at least one of the foregoing; and
   recrystallizing the conductive material such that grain boundaries of the conductive material are arranged substantially orthogonal to a current flow along the length of the cavity, each grain boundary spanning the width and height of the cavity.

7. The method of claim 6, wherein the height to width ratio is about 0.1 to about 0.5.

8. The method of claim 6, wherein after annealing the conductive material has an average grain size greater than the width.

9. The method of claim 6, wherein the conductive material has a bamboo microstructure.

10. The method of claim 6, wherein the conductive material comprises copper and is disposed by electroplating.

11. An interconnect structure, comprising:
a dielectric material layer comprising a cavity having a height, width and length within a dielectric material layer wherein the width is less than or equal to about 100 nanometers and the height to width ratio is less than or equal to about 2.5;
a diffusion barrier liner layer disposed in the cavity on the dielectric material; and
a conductive material disposed on a surface of the diffusion barrier liner to completely fill the cavity, the conductive material having grain boundaries arranged substantially orthogonal to a current flow along the length of the cavity, each grain boundary spanning the width and height of the cavity, the conductive material comprising polysilicon, silicon germanium (SiGe), an alloy thereof, a metal silicide thereof, or a combination comprising at least one of the foregoing.

12. The interconnect structure of claim 11, further comprising a crystallization seed layer disposed between the diffusion barrier liner layer and the conductive material.

13. The interconnect structure of claim 11, wherein the conductive material has an average grain size greater than the width of the opening.

14. The interconnect structure of claim 11, wherein the conductive material has a bamboo microstructure.

15. The interconnect structure of claim 11, wherein the conductive material comprises copper.

16. The interconnect structure of claim 11, wherein the diffusion barrier liner layer comprises tantalum (Ta), titanium (Ti), cobalt (Co), tungsten, ruthenium (Ru), ruthenium tantalum (RuTa), their nitrides, or any combination thereof.

17. The interconnect structure of claim 11, wherein the height to width ratio is about 0.5 to about 2.5.

18. The interconnect structure of claim 11, wherein the conductive material is a conductive metal.

* * * * *